(12) United States Patent
Acimovic

(10) Patent No.: US 8,798,561 B2
(45) Date of Patent: Aug. 5, 2014

(54) RADIO-FREQUENCY CIRCUIT HAVING A TRANSCOUPLING ELEMENT

(75) Inventor: Igor Acimovic, Gatineau (CA)

(73) Assignee: Alcatel Lucent, Boulogne-Billancourt (FR)

( * ) Notice: Subject to any disclaimer, the term of this patent is extended or adjusted under 35 U.S.C. 154(b) by 221 days.

(21) Appl. No.: 13/228,063

(22) Filed: Sep. 8, 2011

(65) Prior Publication Data

US 2013/0063222 A1   Mar. 14, 2013

(51) Int. Cl.
*H01Q 11/12* (2006.01)

(52) U.S. Cl.
USPC .......... 455/126; 455/333; 455/114.3; 333/27; 330/295

(58) Field of Classification Search
USPC .................... 333/27; 330/124, 295
See application file for complete search history.

(56) References Cited

U.S. PATENT DOCUMENTS

| | | | |
|---|---|---|---|
| 4,335,363 A * | 6/1982 | Bowers | 332/180 |
| 5,903,611 A | 5/1999 | Schnabl et al. | |
| 6,311,046 B1 * | 10/2001 | Dent | 455/91 |
| 6,472,934 B1 * | 10/2002 | Pehlke | 330/10 |
| 6,587,514 B1 | 7/2003 | Wright et al. | |
| 6,600,792 B2 | 7/2003 | Antonio et al. | |
| 7,149,257 B2 | 12/2006 | Braithwaite | |
| 7,262,656 B2 * | 8/2007 | Shiikuma | 330/124 R |
| 7,471,739 B1 | 12/2008 | Wright | |
| 7,498,876 B2 | 3/2009 | Peruzzi et al. | |
| 7,583,754 B2 | 9/2009 | Liu | |
| 7,606,324 B2 | 10/2009 | Cai et al. | |
| 7,629,844 B2 * | 12/2009 | Elmala | 330/124 R |
| 7,729,446 B2 | 6/2010 | Copeland | |
| 7,782,979 B2 | 8/2010 | Long | |
| 7,822,146 B2 | 10/2010 | Copeland | |
| 7,904,033 B1 | 3/2011 | Wright et al. | |
| 7,928,799 B2 | 4/2011 | Kusunoki | |
| 7,956,705 B2 * | 6/2011 | Meister et al. | 333/189 |
| 7,957,707 B2 | 6/2011 | Staudinger et al. | |
| 7,961,045 B2 | 6/2011 | Morris et al. | |

(Continued)

OTHER PUBLICATIONS

Horiguchi, Kenichi, et al., "Efficiency Enhancement of a Digital Predistortion Doherty Amplifier Transmitter Using a Virtual Open Stub Technique," IEICE Trans. Electron., vol. E90-C, No. 9, Sep. 2007, pp. 1670-1677.

(Continued)

*Primary Examiner* — Temesgh Ghebretinsae
*Assistant Examiner* — Richard Chan
(74) *Attorney, Agent, or Firm* — Mendelsohn, Drucker & Dunleavy, P.C.; Yuri Gruzdkov; Steve Mendelsohn

(57) ABSTRACT

An RF circuit having a transcoupler, a multifunctional RF-circuit element that can operate both as an impedance inverter and as a signal coupler. When connected to a fixed load impedance, the transcoupler can also operate as an impedance transformer. The impedance-transformer/inverter functionality of the transcoupler can be used, e.g., to modulate the load of a power amplifier. The signal coupler functionality of the transcoupler can be used, e.g., to generate a corresponding feedback signal indicative of phase and/or amplitude distortions in the amplifier. The use of various embodiments of the transcoupler in an RF circuit can be advantageous, for example, because the transcoupler has a lower insertion loss than a cascade consisting of a prior-art impedance inverter and a prior-art directional coupler, occupies a relatively small area on the printed circuit board, and helps to reduce the per-unit fabrication and operating costs.

20 Claims, 5 Drawing Sheets

(56) References Cited

U.S. PATENT DOCUMENTS

| | | | |
|---|---|---|---|
| 8,005,162 | B2 | 8/2011 | Cai et al. |
| 2008/0297277 | A1* | 12/2008 | Meister et al. .............. 333/189 |
| 2009/0256632 | A1 | 10/2009 | Klingberg et al. |
| 2011/0204976 | A1* | 8/2011 | Masuda ...................... 330/195 |
| 2013/0063208 | A1* | 3/2013 | Acimovic .................... 330/84 |
| 2013/0063222 | A1* | 3/2013 | Acimovic .................... 333/27 |

OTHER PUBLICATIONS

Eun, Sang-Ki, et al., "A High Linearity Chireix Outphasing Power Amplifier Using Composite Right/Left-Handed Transmission Lines," Proceedings of the 37th European Microwave Conference, Oct. 2007, Munich Germany, pp. 1622-1625.

Aschbacher, Di Ernst, "Digital Pre-distortion of Microwave Power Amplifiers," Vienna. University of Technology, PhD. Thesis, Sep. 2005 (139 pages).

Franco, Marcelo Jorge, "Wideband Digital Predistortion Linearization of Radio Frequency Power Amplifiers with Memory," Drexel University, PhD. Thesis, Apr. 2005 (195 pages).

Mekechuk, Kelly, et al., "Linearizing Power Amplifiers Using Digital Predistortion, EDA Tools and Test Hardware," High Frequency Electronics, Apr. 2004 (7 pages).

Wood, Simon, et al., "A High Efficiency Doherty Amplifier with Digital Predistortion for WiMAX," High Frequency Electronics, Dec. 2008 (7 pages).

Ding, Lei, "Digital Predistortion of Power Amplifiers for Wireless Applications," School of Electrical and Computer Engineering Georgia Institute of Technology, PhD. Thesis, Mar. 2004 (117 pages).

Gerhard, Walter, et al., "Predistortion of Chireix Power Amplifiers," FREQUENZ Journal, vol. 62, Sep.-Oct. 2008, pp. 229-235, Verlag Schiele & Schoen GmbH, Germany, www.schiele-schoen.de.

Brunmayr, Peter, "Implementation of a Nonlinear Digital Pre-distortion Algorithm" M.S. thesis, Vienna University of Technology, Institute of Communications and Radio-Frequency Engineering, Vienna, Austria, 2005 (81 pages).

Qureshi, Jawad H., et al., "A 90-W Peak Power GaN Outphasing Amplifier With Optimum Input Signal Conditioning," IEEE Transactions on Microwave Theory and Techniques, vol. 57, No. 8, Aug. 2009, pp. 1925-1935.

Raab, Frederick H., et al., "Power Amplifiers and Transmitters for RF and Microwave," IEEE Transactions on Microwave Theory and Techniques, vol. 50, No. 3, Mar. 2002 pp. 814-826.

Viswanathan, Vani, "Efficiency Enhancement of Base Station Power Amplifiers Using Doherty Technique," M. Sc. Thesis, Virginia Polytechnic Institute and State University, 2004 (84 pages).

\* cited by examiner

100

500

RADIO-FREQUENCY CIRCUIT HAVING A TRANSCOUPLING ELEMENT

CROSS-REFERENCE TO RELATED APPLICATIONS

The subject matter of this application is related to that of U.S. Patent Application Publication No. 2010/0063208, which is incorporated herein by reference in its entirety.

BACKGROUND

1. Field of the Invention

The present invention relates to equipment for telecommunication systems and, more specifically but not exclusively, to radio-frequency (RF) transmitters and power amplifiers, and passive RF circuits suitable for use therein.

2. Description of the Related Art

This section introduces aspects that may help facilitate a better understanding of the invention(s). Accordingly, the statements of this section are to be read in this light and are not to be understood as admissions about what is in the prior art or what is not in the prior art.

A recent trend in the telecommunications industry includes the introduction of wideband digital-modulation systems, such as the third generation (3G) cellular-system wideband code-division-multiple-access (WCDMA) and the fourth generation (4G) cellular-system orthogonal frequency-division multiple-access (OFDMA). This trend has had a profound effect on power-amplifier specifications because an RF power amplifier used in a wideband digital-modulation system needs to properly and efficiently handle a signal that has a fast-changing envelope, a high peak-to-average power ratio (PAPR), and a bandwidth that can be tens of megahertz. In addition, for cost reasons, a single power amplifier is usually configured to amplify multiple modulated carriers.

A typical RF power amplifier is inherently nonlinear, with its gain being a function of the output-power level. The gain usually decreases when the output power approaches the saturation level of the amplifier, and the phase of the gain can either increase or decrease, depending on the type of the active medium. Amplitude and/or phase distortions in the power amplifier tend to cause the generation of spurious spectral components often referred to as inter-modulation-distortion (IMD) products. IMD products are detrimental, for example, because they increase the level of interference between adjacent RF channels.

SUMMARY

Disclosed herein are various embodiments of an RF circuit having a transcoupler, a multifunctional RF-circuit element that can operate both as an impedance inverter and as a signal coupler. When connected to a fixed load impedance, the transcoupler can also operate as an impedance transformer. The impedance-transformer/inverter functionality of the transcoupler can be used, e.g., to modulate the load of a power amplifier. The signal coupler functionality of the transcoupler can be used, e.g., to generate a corresponding feedback signal indicative of phase and/or amplitude distortions in the amplifier. The use of various embodiments of the transcoupler in an RF circuit can be advantageous, for example, because the transcoupler has a lower insertion loss than a cascade consisting of a prior-art impedance inverter and a prior-art directional coupler, occupies a relatively small area on the printed circuit board, and helps to reduce the per-unit fabrication and operating costs.

According to one embodiment, provided is an RF circuit for handling modulated signals. The RF circuit has a first transcoupling element that comprises a first branch having a first end and a second end, and a second branch electromagnetically coupled to the first branch. The first branch is configured to operate as an impedance inverter that presents at the first end a first impedance, said first impedance being proportional to an inverse of a second impedance presented to the first branch at the second end. The second branch is configured to operate as a signal coupler that receives an attenuated copy of a signal from the first branch.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

One method that can be used to linearize the nonlinear response of a radio-frequency (RF) power amplifier over its intended dynamic range is digital pre-distortion (DPD). DPD works in the digital domain and uses digital-signal-processing techniques to pre-distort a baseband signal before modulation, up-conversion, and amplification. With DPD, the power amplifier can be utilized substantially up to its saturation point while maintaining a sufficiently accurate linear relationship between the input and output signals. DPD is an attractive technique, e.g., because it can significantly increase the power efficiency of a power amplifier and be implemented using standard and/or inexpensive circuit components. A high degree of flexibility can be achieved if programmable hardware is used, such as digital signal processors (DSPs) and/or field-programmable gate arrays (FPGAs). In addition, DPD does not require significant changes in the schematics of the costly analog part (e.g., the RF-output circuit) of the corresponding transmitter and lends itself to various advantageous implementations in which the analog front end of the transmitter has a relatively small size, and the configurable digital part of the transmitter can be placed very close to the antenna.

Figure 1:
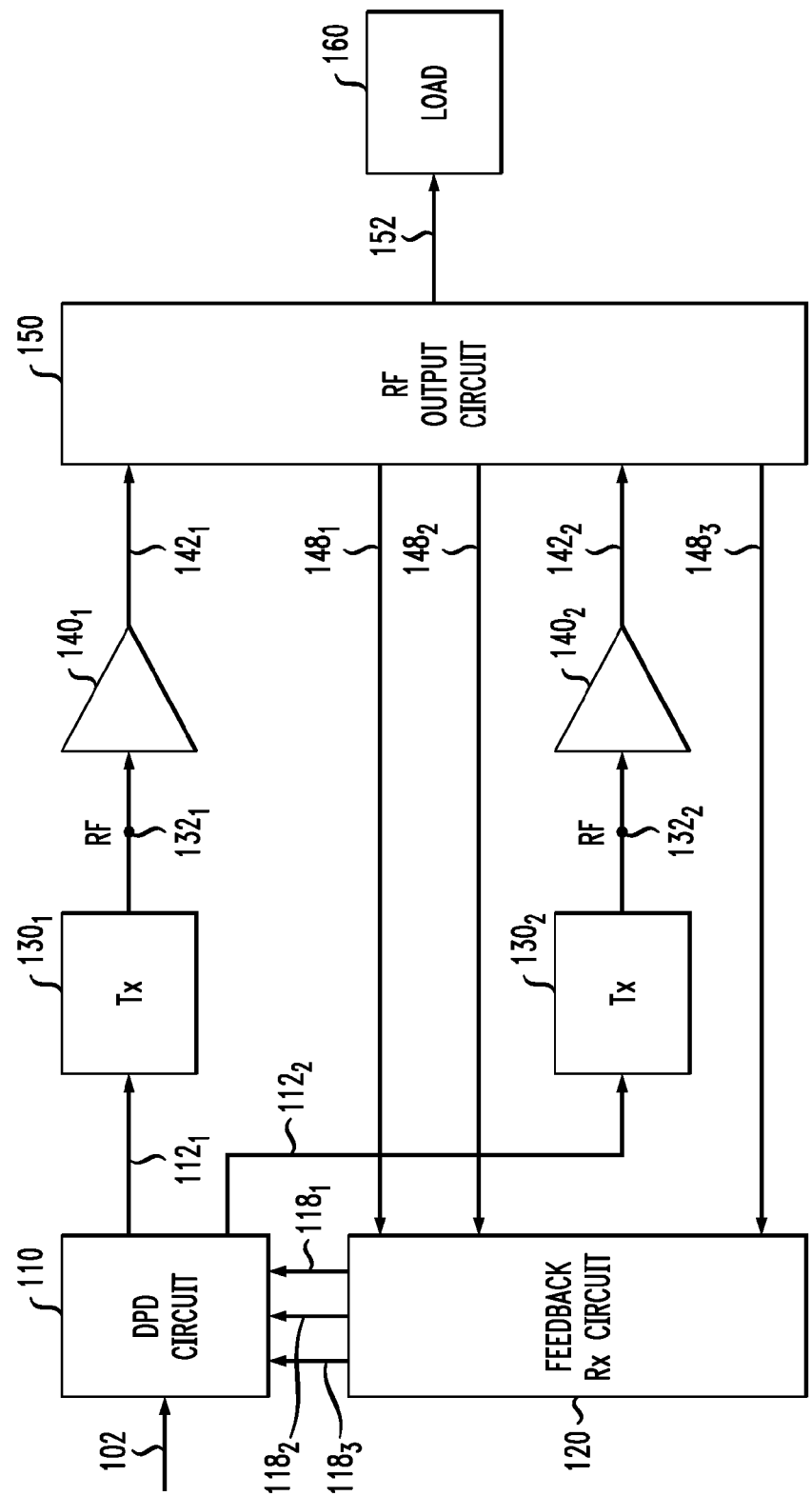
FIG. 1 shows a block diagram of a radio-frequency (RF) transmitter according to one embodiment of the invention.

FIG. 1 shows a block diagram of an RF transmitter 100 according to one embodiment of the invention. Transmitter 100 uses a Doherty amplification scheme to convert a digital input signal 102 into an analog RF-output signal 152. Output signal 152 is applied to an output load (e.g., an antenna) 160. A feedback path comprising a feedback-receiver (FBR) circuit 120 and a DPD circuit 110 enables transmitter 100 to apply digital pre-distortion to input signal 102, thereby suppressing IMD products in output signal 152.

The Doherty amplification scheme of transmitter 100 employs power amplifiers 140$_1$ and 140$_2$ connected in parallel as indicated in FIG. 1. Output signals 142$_1$ and 142$_2$ generated by amplifiers 140$_1$ and 140$_2$, respectively, are combined in an RF-output circuit 150 as further described below in reference to FIGS. 3-4 to produce output signal 152. Amplifier 140$_1$ is configured to operate, e.g., as a class-B or a class-AB amplifier and is also referred to as a primary or carrier stage. Amplifier 140$_2$ is configured to operate, e.g., as a class-C amplifier and is also referred to as an auxiliary or peak stage. A brief description of operating configurations corresponding to the pertinent amplifier classes can be found, e.g., in U.S. Pat. Nos. 7,498,876 and 7,928,799, both of which are incorporated herein by reference in their entirety.

Due to different configurations of amplifiers 140$_1$ and 140$_2$, only amplifier 140$_1$ provides signal amplification when input signal 102 and therefore RF signals 132$_1$ and 132$_2$ are small. Amplifier 140$_2$ remains turned off until RF signal 132$_2$ reaches a certain threshold level. Near this threshold level, amplifier 140$_1$ is close to saturation, and amplifier 140$_2$ turns on to supply the output-signal portion that tends to be clipped off by the near-saturation operating regime of amplifier 140$_1$. This complementary action of amplifiers 140$_1$ and 140$_2$ enables transmitter 100 to advantageously have relatively high power efficiency for a wide range of input-signal levels. A more detailed explanation of how high power efficiency can be achieved for amplifiers 140$_1$ and 140$_2$ is provided below in reference to FIG. 3.

In addition to producing output signal 152 by properly combining signals 142$_1$ and 142$_2$, RF-output circuit 150 is configured to generate feedback signals 148$_1$-148$_3$ based on signals 142$_1$, 142$_2$, and 152 and supply these feedback signals to FBR circuit 120. In one embodiment, feedback signal 148$_1$ provided by RF-output circuit 150 to FBR circuit 120 is an attenuated copy of signal 142$_1$; feedback signal 148$_2$ is an attenuated copy of signal 142$_2$; and feedback signal 148$_3$ is an attenuated copy of signal 152. In various alternative embodiments, RF-output circuit 150 can be configured to provide to FBR circuit 120 only two of feedback signals 148$_1$-148$_3$ and/or generate each of feedback signals 148$_1$-148$_3$ based on a respective different linear combination of signals 142$_1$, 142$_2$, and 152.

In one embodiment, FBR circuit 120 comprises three feedback receivers (not explicitly shown in FIG. 1), each configured to process a corresponding one of feedback signals 148$_1$-148$_3$. The typical processing performed by a feedback receiver includes down-converting the corresponding feedback signal 148 to baseband and applying analog-to-digital conversion to the resulting analog baseband signal to generate a corresponding digital feedback signal 118. Digital feedback signals 118$_1$-118$_3$ generated by FBR circuit 120 correspond to analog feedback signals 148$_1$-148$_3$, respectively.

In general, the gain, efficiency, and AM-PM (amplitude-to-phase modulation) characteristics (e.g., the insertion-phase change as a function of signal amplitude) of a power amplifier, such as power amplifier 140$_1$ or 140$_2$, are all functions of both the output power and the load impedance. In a typical prior-art DPD scheme, the individual stimuli (input signals) for the carrier and peak stages of a Doherty power amplifier are generated by means of a 3-dB power splitter configured to split the RF signal that is generated based on a single pre-distorted digital signal generated by the DPD circuit. This means that the stimuli applied to the carrier and peak stages have a fixed phase relationship with one another. However, as already indicated above, the carrier and peak stages of a Doherty power amplifier are configured to operate in different regimes, which causes their output signals to generally have a phase mismatch between them. Moreover, this phase mismatch varies over time owing to the variations in the output-power level. Disadvantageously, this prior-art DPD scheme is not capable of equalizing the phase mismatch and relies mostly on amplitude pre-distortion for the suppression of IMD products.

This and other pertinent problems in the prior art are addressed in transmitter 100 by configuring DPD circuit 110 to generate individually pre-distorted digital signals 112$_1$ and 112$_2$ for amplifiers 140$_1$ and 140$_2$, respectively, based on multiple digital feedback signals, e.g., two or three of signals 118$_1$-118$_3$. These feedback signals provide sufficient information to enable the DPD circuit to implement both amplitude pre-distortion and phase equalization for amplifiers 140$_1$ and 140$_2$. In part due to a relatively small phase mismatch between output signals 142$_1$ and 142$_2$, transmitter 100 is able to better suppress IMD products in its output signal (i.e., signal 152) than a comparable prior-art transmitter.

In one configuration, DPD circuit 110 uses digital feedback signals 118$_1$-118$_3$ to adaptively pre-distort input signal 102 to generate individually pre-distorted digital signals 112$_1$ and 112$_2$. Pre-distorted digital signal 112$_1$ is applied to a transmitter 130$_1$, where it is first converted into a corresponding analog signal (not explicitly shown in FIG. 1). Transmitter 130$_1$ then up-converts this analog signal from baseband to generate RF signal 132$_1$. Pre-distorted digital signal 112$_2$ is similarly processed in a transmitter 130$_2$ to generate RF signal 132$_2$. As already indicated above, RF signals 132$_1$ and 132$_2$ are the input signals (stimuli) that are applied to amplifiers 140$_1$ and 140$_2$, respectively.

DPD circuit 110 is configured to generate pre-distorted digital signal 112$_1$ by applying a first nonlinear function to input signal 102, wherein the first nonlinear function creates an expanding nonlinearity that is an approximate inverse of the compressing nonlinearity of (e.g., compressive amplitude distortion in) amplifier 140$_1$. DPD circuit 110 is further configured to generate pre-distorted digital signal 112$_2$ by applying a second nonlinear function to input signal 102, wherein the second nonlinear function creates a nonlinearity that is an approximate inverse of the nonlinearity of amplifier 140$_2$. As already indicated above, the first and second nonlinear functions usually differ from one another due to different operating configurations of amplifiers 140$_1$ and 140$_2$.

In various alternative configurations, DPD circuit 110 can similarly apply other types of first and/or second nonlinear functions to input signal 102 to generate pre-distorted digital signals 112$_1$ and 112$_2$. In general, the first and second nonlinear functions are constructed in an inter-related manner to cause the forward signal path comprising DPD circuit 110, transmitters 130$_1$ and 130$_2$, amplifiers 140$_1$ and 140$_2$, and RF-output circuit 150 to exhibit substantially linear signal-transfer characteristics. By substantially linear signal-transfer characteristics, it is meant that, with digital pre-distortion, the relationship between output signal 152 and input signal 102 can be approximated well by a constant gain, e.g., a complex or real gain value that does not depend on the input- (or output-) signal level within the intended dynamic range of transmitter 100. Description of representative DPD circuits and algorithms that can be used to implement DPD circuit 110 can be found, e.g., in U.S. Pat. Nos. 7,957,707, 7,904,033, 7,822,146, 7,782,979, 7,729,446, 7,606,324, 7,583,754, and 7,471,739, all of which are incorporated herein by reference in their entirety.

Figure 2:
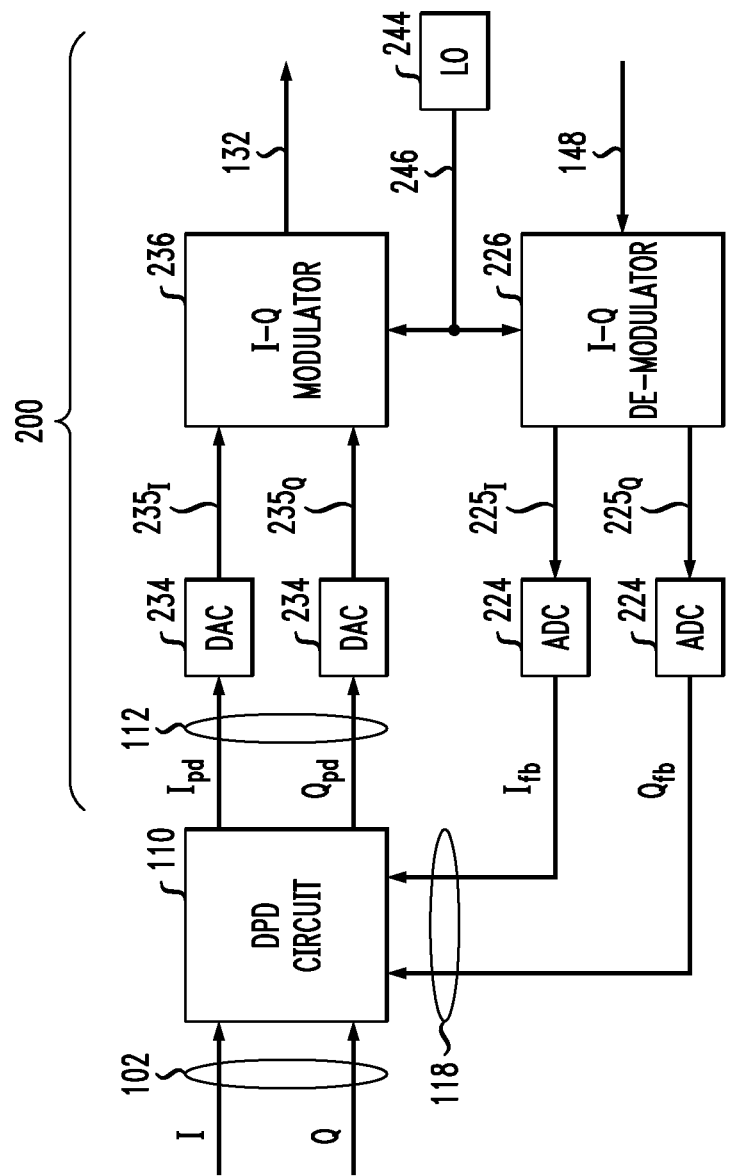
FIG. 2 shows a block diagram of a transceiver that can be used in the RF transmitter of FIG. 1 according to one embodiment of the invention.

FIG. 2 shows a block diagram of a transceiver 200 that can be used in transmitter 100 (FIG. 1) according to one embodiment of the invention. Note that DPD circuit 110 shown in FIG. 2 is not part of transceiver 200. Digital-to-analog converters (DACs) 234 and an I-Q modulator 236 can be used to implement transmitter 130₁ or transmitter 130₂. Analog-to-digital converters (ADCs) 224 and an I-Q de-modulator 226 can be used to implement a portion of FBR circuit 120. Transceiver 200 also has a local-oscillator (LO) source 244 that is configured to supply a local-oscillator (carrier-frequency) signal 246 to I-Q modulator 236 and I-Q de-modulator 226. In a representative embodiment, transmitter 100 may have more than one instance of transceiver 200.

In operation, I-Q de-modulator 226 demodulates feedback signal 148 in a conventional manner by mixing it with LO signal 246. A resulting baseband signal 225 generated by I-Q de-modulator 226 has two components: an in-phase component $225_I$ and a quadrature-phase component $225_Q$. Signals $225_I$ and $225_Q$ are analog signals that are converted into digital form by ADCs 224. The resulting digital signals $I_{fb}$ and $Q_{fb}$ are components of the corresponding one of digital signals 118₁-118₃ (also see FIG. 1).

DPD circuit 110 uses digital signals $I_{fb}$ and $Q_{fb}$ to determine the amount of distortion in the forward signal path of transmitter 100 (FIG. 1). For example, a symbol received by DPD circuit 110 via digital signals $I_{fb}$ and $Q_{fb}$ can be combined with (e.g., summed with and/or subtracted from) one or more corresponding symbols received by the DPD circuit via the other one or more digital signals 118 (see FIG. 1). DPD circuit 110 then uses the corresponding original constellation symbol received via input signal 102 to determine the amount of pre-distortion that needs to be applied to the original I and Q components to counteract (e.g., cancel or significantly reduce) the distortion imposed by the forward signal path. The determined amount of pre-distortion can be partitioned, in any suitable manner, into a first portion and a second portion. The first portion, in form of the first nonlinear function, is applied to input signal 102 to generate pre-distorted digital signal 112₁, while the second portion, in form of the second nonlinear function, is similarly applied to input signal 102 to generate pre-distorted digital signal 112₂. Similar to signals 102 and 118, signal 112 is shown as having two components: an in-phase component labeled $I_{pd}$ and a quadrature-phase component labeled $Q_{pd}$. Note that FIG. 2 shows the generation of only one of pre-distorted digital signals 112₁ and 112₂. The other one of these signals can be similarly generated.

Components $I_{pd}$ and $Q_{pd}$ of pre-distorted digital signal 112 are converted, in DACs 234, into analog signals $235_I$ and $235_Q$, respectively. I-Q modulator 236 then uses analog signals $235_I$ and $235_Q$ to modulate LO signal 246. The resulting modulated carrier signal is RF signal 132 (also see FIG. 1). As already indicated above, signal 132 generated by I-Q modulator 236 can be one of signals 132₁ and 132₂ (see FIG. 1). The other one of these signals can be similarly generated.

Figure 3:
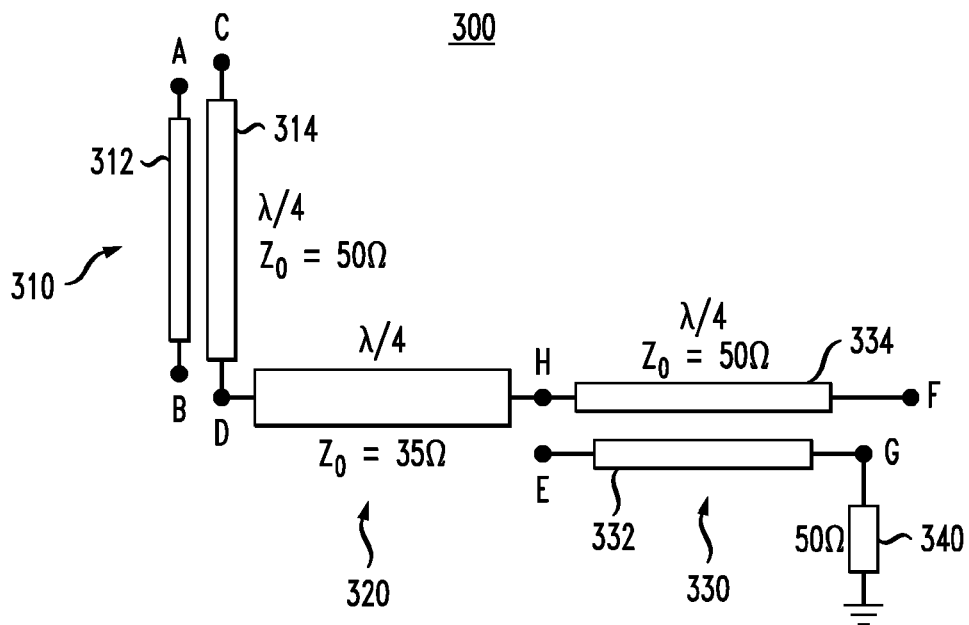
FIG. 3 shows a circuit diagram of an RF circuit that can be used in the RF transmitter of FIG. 1 according to one embodiment of the invention.

FIG. 3 shows a circuit diagram of an RF circuit 300 that can be used as RF-output circuit 150 (FIG. 1) according to one embodiment of the invention. RF circuit 300 comprises a transcoupler 310, an impedance transformer 320, a directional coupler 330, and six terminals labeled A through F. The impedances indicated in FIG. 3 are exemplary and correspond to an implementation in which each of the external terminals is intended for being connected to a 50-Ohm line, driver, load, or terminator. One of ordinary skill in the art will understand how to change the various impedance values shown in FIG. 3 to match RF circuit 300 to an impedance value different from 50 Ohm.

In a representative configuration, terminals A-F can be connected as follows. Terminal A is configured to carry feedback signal 148₁ (see FIGS. 1 and 2). Terminal B is configured to carry feedback signal 148₂ (see FIGS. 1 and 2). Terminal C is configured to receive amplified signal 142₁ (see FIG. 1). Terminal D is configured to receive amplified signal 142₂ (see FIG. 1). Terminal E is configured to carry feedback signal 148₃ (see FIGS. 1 and 2). Terminal F is configured to apply output signal 152 to load 160.

This representative configuration can be modified to produce several alternative configurations. For example, three different alternative configurations can be obtained by changing the connection of terminal A, B, or E from the above-indicated to a 50-Ohm terminator. In each of these three alternative configurations, RF circuit 300 will provide only two of feedback signals 148₁-148₃.

Transcoupler 310 is a four-terminal device having two parallel branches 312 and 314 that are located sufficiently close to each other for an RF signal propagating through branch 314 to electromagnetically couple into branch 312. Branch 314 comprises a quarter-wave impedance inverter disposed between terminals C and D. The signal coupling between branches 312 and 314 is relatively weak, e.g., about −30 dB, which ensures a minimal influence of branch 312 on the operation of the quarter-wave impedance inverter in branch 314.

In operation, the quarter-wave impedance inverter of branch 314 can be used to implement active load modulation for carrier stage 140₁, for example, as follows (also see FIG. 1).

At low input-signal levels, peak stage 140₂ is in the off state while carrier stage 140₁ acts as a controlled current source. Peak stage 140₂ (ideally) sees infinite impedance, and the impedance inverter of branch 314 causes carrier stage 140₁ to see a higher than 50-Ohm impedance load. The higher impedance load causes carrier stage 140₁ to reach near-saturation when its output current reaches only about one half of its nominal maximum value. When carrier stage 140₁ is close to saturation, it advantageously works with nearly maximum power efficiency.

As soon as the input-signal level becomes sufficiently high to turn on peak stage 140₂, the peak stage begins to apply additional current to terminal D. Peak stage 140₂ now acts as a controlled current source, and carrier stage 140₁ acts as a controlled voltage source. The additional current applied by peak stage 140₂ to terminal D causes an increase in the output impedance seen by the quarter-wave impedance inverter of branch 314. Since the input and output impedances of a quarter-wave impedance inverter are related to one another as duals, the increase in the output impedance causes a corresponding decrease in the input impedance. Note that the input impedance of the quarter-wave impedance inverter of branch 314 is the load that is seen by carrier stage 140₁. As the load of carrier stage 140₁ decreases, the output current of the carrier stage increases, with the output voltage remaining close to the saturation level.

As the input-signal level increases further, the output impedance of the quarter-wave impedance inverter of branch 314 keeps increasing, and the effective load of carrier stage 140₁ keeps decreasing. In this manner, the impedance inverter of branch 314 enables peak stage 140₂ to modulate the load of carrier stage 140₁ during high input-signal levels. The load modulation, in turn, keeps carrier stage 140₁ operating in a regime that is characterized by advantageously high power efficiency.

Impedance transformer 320 comprises a length of transmission line that is one-quarter of a wavelength long and has an impedance of about 35 Ohm. (Note that, for a device that has a desired operating-frequency range, the quarter-wave length typically corresponds to the center frequency of that operating range.) Since impedance transformer 320 is terminated at 50 Ohm by directional coupler 330, it presents at terminal D an input impedance of 25 Ohm. The latter impedance matches the output impedance of two 50-Ohm transmission lines connected in parallel to terminal D.

Directional coupler 330 comprises branches 332 and 334. Branch 334 operates to present a fixed 50-Ohm termination to impedance transformer 320. The signal coupling between branches 332 and 334 is relatively weak, e.g., about −30 dB. Terminal G is connected to a 50-Ohm terminator 340. Terminal E outputs an attenuated copy of the RF signal presented at terminal H by impedance transformer 304.

Feedback signals $S_A$, $S_B$, and $S_E$ collected at terminals A, B, and E, respectively, of RF circuit 300 can be used to directly measure effective transfer functions $T_1$ and $T_2$ of stages $140_1$ and $140_2$, for example, based on Eqs. (1)-(3):

$$T_1 = \frac{S_A}{ap_1} \quad (1)$$

$$T_2 = \frac{S_B}{ap_2} \quad (2)$$

$$T_1 p_1 + T_2 p_2 = \frac{S_E}{c} \quad (3)$$

where a is a constant that represents the signal-coupling strength between branches 312 and 314; c is a constant that represents the signal-coupling strength between branches 332 and 334; and $p_1$ and $p_2$ represent pre-distorted signals $112_1$ and $112_2$, respectively. The measurement can be done on line or using an appropriate off-line calibration procedure. In principle, any two of Eqs. (1)-(3) are sufficient for the determination of transfer functions $T_1$ and $T_2$, provided that the coupling strengths are known. The use of all three equations enables the determination of the ratio (a/c) of the coupling strengths and, as such, can be used when only one of the two coupling strengths is known. After the individual transfer functions of stages $140_1$ and $140_2$ are determined, their reciprocals can be used in a relatively straightforward manner for amplitude pre-distortion and phase equalization.

Figure 4:
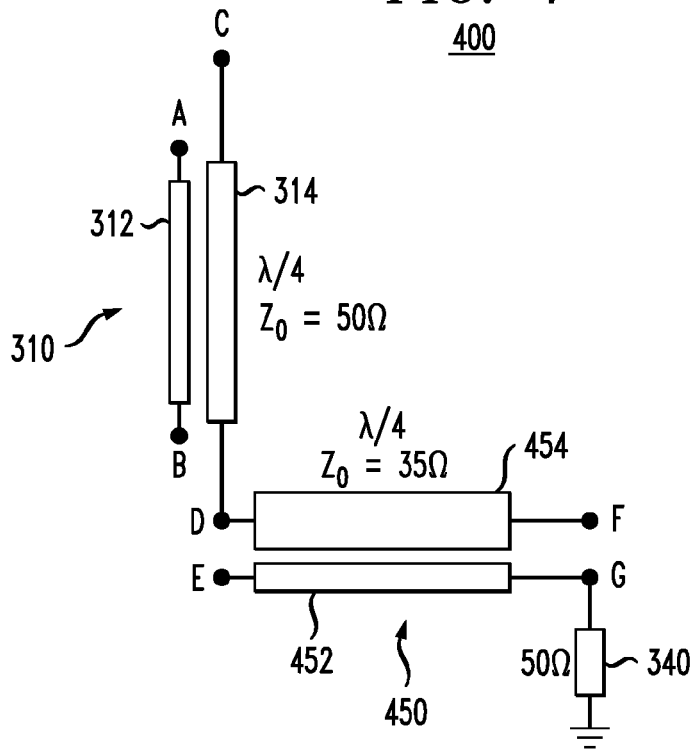
FIG. 4 shows a circuit diagram of an RF circuit that can be used in the RF transmitter of FIG. 1 according to another embodiment of the invention.

FIG. 4 shows a circuit diagram of an RF circuit 400 that can be used as RF-output circuit 150 (FIG. 1) according to another embodiment of the invention. In terms of its intended function, RF circuit 400 is generally analogous to RF circuit 300 (FIG. 3). Therefore, the above-described connections of terminals A-F apply to RF circuit 400 as well as to RF circuit 300. However, one difference between RF circuits 300 and 400 is that the latter employs a transcoupler 450 that performs the functions that are similar to the above-described functions of both impedance transformer 320 and directional coupler 330 (see FIG. 3).

The use of transcoupler 450 can provide one or more of the following benefits/advantages:
(1) A transmitter (e.g., transmitter 100, FIG. 1) employing RF circuit 400 can have a relatively high power efficiency, e.g., because transcoupler 450 has a lower insertion loss than a series consisting of impedance transformer 320 and directional coupler 330;
(2) RF circuit 400 can have a relatively small size because transcoupler 450 occupies a relatively small area on a printed circuit board (PCB); and
(3) The relatively small size of transcoupler 450 and the improved power efficiency of the corresponding power amplifier can be leveraged to reduce per-unit fabrication and operating costs.

As evident from the description of transcouplers 310 and 450 in FIGS. 3 and 4, a transcoupler is a circuit element that has two branches that can be referred to as the main branch and the auxiliary branch, respectively. The main branch has a length of about one quarter of the carrier wavelength and is configured to operate as an impedance inverter that presents a first impedance at the first end of the branch, said first impedance being proportional to an inverse of a second impedance presented to the branch at the second end of the branch. If the second impedance is a fixed impedance, then the first branch operates as a quarter-wave impedance transformer. Branches 314 and 454 are the main branches in transcouplers 310 and 450, respectively. The auxiliary branch is electromagnetically coupled to the main branch and configured to operate as a signal coupler that receives an attenuated copy of a signal from the main branch. Branches 312 and 452 are the auxiliary branches in transcouplers 310 and 450, respectively.

Figure 5:
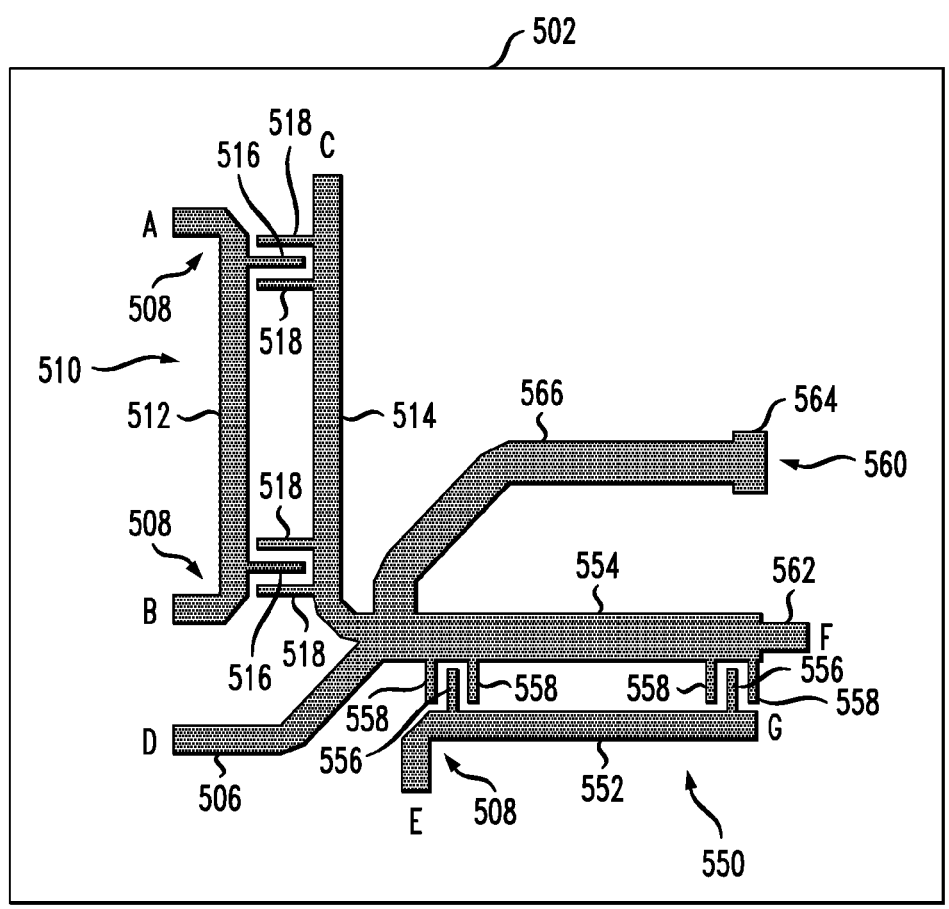
FIG. 5 shows a top view of a microstrip circuit that can be used to implement the RF circuit of FIG. 4 according to one embodiment of the invention.

FIG. 5 shows a top view of a microstrip circuit 500 that can be used to implement RF circuit 400 (FIG. 4) according to one embodiment of the invention. Circuit 500 comprises a dielectric substrate 502 and two conducting layers attached to the opposite (e.g., top and bottom) sides of the dielectric substrate. Only the patterned top layer is visible in the view provided in FIG. 5. The various microstrip shapes of this patterned layer define the circuit elements of circuit 500. The bottom layer (typically referred to as the "ground plane") is not visible in the view provided in FIG. 5. In a representative embodiment, the ground plane is not patterned and comprises a continuous layer of metal, such as copper.

Circuit 500 has seven terminals labeled A through G. The terminals labeled by the same letter in FIGS. 4 and 5 are functionally similar. Therefore, the terminals of circuit 500 can be electrically connected to external circuits, e.g., as already described above in reference to FIGS. 3 and 4.

Microstrips 512 and 514 are used to implement a transcoupler 510 that is analogous to transcoupler 310 (see FIGS. 3 and 4). Microstrip 514 is one-quarter of a wavelength long. Microstrip 512 is electromagnetically coupled to microstrip 514 using two interdigitated combs. One of the combs is electrically connected to microstrip 512 and is illustratively shown in FIG. 5 as having two fingers 516. The other comb is electrically connected to microstrip 514 and is illustratively shown in FIG. 5 as having four fingers 518. Two mitred bends 508 are used to electrically connect microstrip 512 to terminals A and B.

Microstrips 552 and 554 are used to implement a transcoupler 550 that is analogous to transcoupler 450 (see FIG. 4). Microstrip 554 is one-quarter of a wavelength long. Microstrip 552 is electromagnetically coupled to microstrip 554 using two interdigitated combs. One of the combs is attached to a side of microstrip 552 and is illustratively shown in FIG. 5 as having two fingers 556. The other comb is attached to a side of microstrip 554 and is illustratively shown in FIG. 5 as having four fingers 558. A mitred bend 508 is used to electrically connect microstrip 552 to terminal E. Microstrips 516 and 562 are used to electrically connect the ends of microstrip 554 to terminals D and F, respectively.

Circuit 500 also has an optional shunted stub 560 that is connected to transcoupler 550 as indicated in FIG. 5. Stub 560 is implemented using a microstrip 566 and a shunt 564 that is located at the distal end of that microstrip. Microstrip 566 is one-quarter of a wavelength long. Shunt 564 comprises one or more electrically conducting vias in dielectric substrate 502 that electrically connect the distal end of microstrip 566 to the ground plane, thereby short-circuiting stub 560. One function of stub 560 is to alter the effective impedance of transcoupler 550 compared to the impedance that the transcoupler would have without the stub. The altered impedance advantageously has an imaginary part that is substantially nulled and has a very weak frequency dependence within the pertinent spectral range around the nominal carrier frequency.

Note that each of microstrips 506, 512, 514, 552, and 562 has a first specified width, and each of microstrips 554 and 566 has a second specified width that is greater than the first. In a representative embodiment, the first and second widths are selected so that (i) each of the RF-transmission lines represented by microstrips 506, 512, 514, 552, and 562 has an impedance of 50 Ohm and (ii) each of the RF-transmission lines represented by microstrips 554 and 566 has an impedance of 35 Ohm. One skilled in the art will understand how to select other respective widths for these two sets of microstrips to obtain other impedance values.

Figure 6:
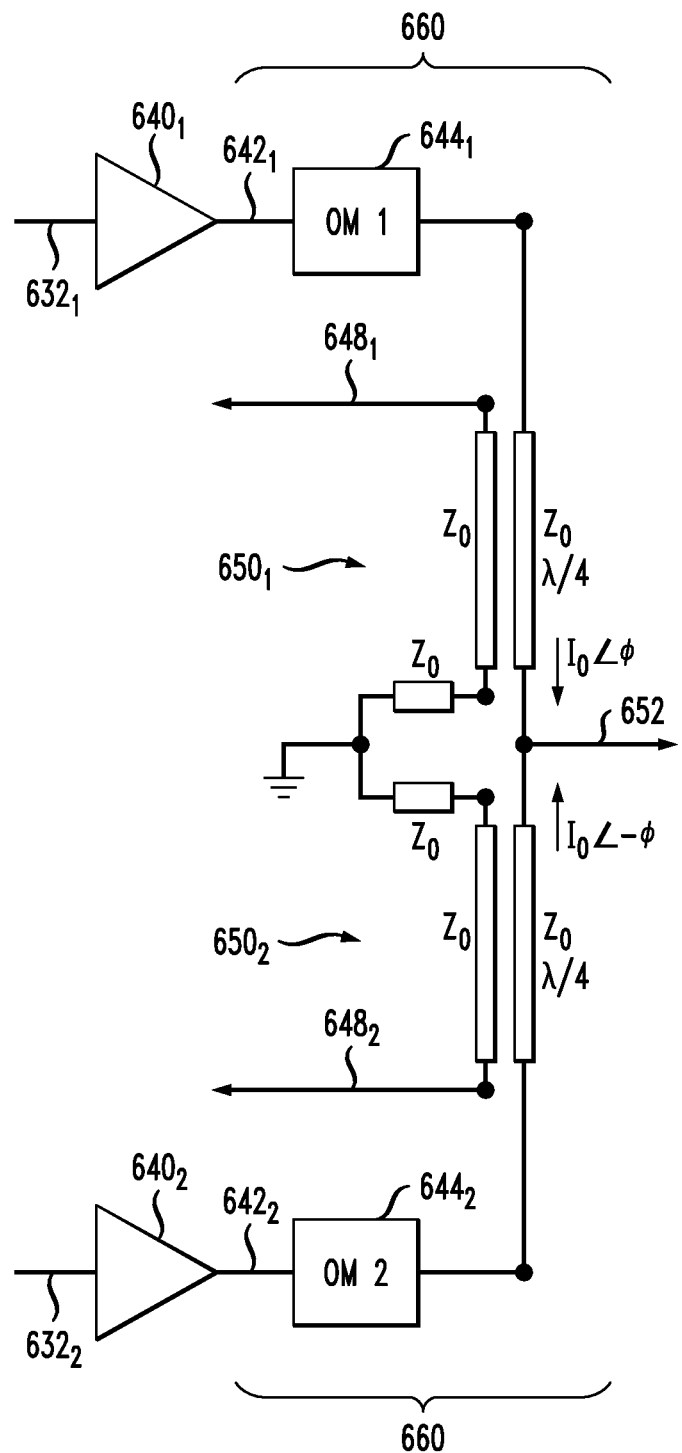
FIG. 6 shows a circuit diagram of a two-stage amplifier according to one embodiment of the invention.

FIG. 6 shows a circuit diagram of a two-stage/branch amplifier circuit 600 according to one embodiment of the invention. Circuit 600 can be used, e.g., to implement a Chireix amplification scheme. A circuit diagram of the corresponding transmitter can be obtained, e.g., by replacing amplifiers $140_1$ and $140_2$ and RF-output circuit 150 in transmitter 100 (FIG. 1) by circuit 600. More specifically, signals/lines $632_1$, $632_2$, $648_1$, $648_2$, and 652 in circuit 600 correspond to signals/lines $132_1$, $132_2$, $148_1$, $148_2$, and 152, respectively, in transmitter 100.

The Chireix amplification scheme of circuit 600 employs power amplifiers $640_1$ and $640_2$ connected in parallel as indicated in FIG. 6. Output signals $642_1$ and $642_2$ generated by amplifiers $640_1$ and $640_2$, respectively, are combined in an RF-output circuit 660 comprising output-matching circuits $644_1$ and $644_2$ and transcouplers $650_1$ and $650_2$. Amplifiers $640_1$ and $640_2$ are configured to generate signals $642_1$ and $642_2$ to be each other's complex conjugates and to have a constant envelope. After RF-output circuit 660 combines phase-modulated signals $642_1$ and $642_2$, output terminal D of that circuit has the corresponding amplitude-modulated signal 652.

Similar to RF-output circuits 300 and 400 (FIGS. 3 and 4), RF-output circuit 660 uses load-impedance modulation to achieve relatively high power efficiency for the amplifier stages. Transcoupler $650_1$ is configured to invert the load impedance, which is then transformed by output-matching circuit $644_1$ and presented to amplifier $640_1$. Transcoupler $650_2$ is similarly configured to invert the load impedance, which is then transformed by output-matching circuit $644_2$ and presented to amplifier $640_2$.

To properly convert phase-modulated signals $642_1$ and $642_2$ into amplitude-modulated signal 652, the deviation from the prescribed complex conjugate-phase relationship between the two amplifier branches in circuit 600 needs to be as small as possible. Circuit 600 helps to achieve this result by providing feedback signals $648_1$ and $648_2$ for use with an appropriate DPD circuit that can be similar to DPD circuit 110 of transmitter 100. Transcoupler $650_1$ is configured to generate feedback signal $648_1$. Transcoupler $650_2$ is similarly configured to generate feedback signal $648_2$. Based on these feedback signals, the corresponding DPD circuit can pre-distort signals $632_1$ and $632_2$ to achieve relatively accurate phase conjugation at terminal D.

In general, transcoupling elements analogous to transcouplers 450, 550, and 650 can be used in any multistage or multi-branch power-amplifier circuit configured to combine RF-output signals from two or more branches of amplifying elements and use feedback-based digital pre-distortion to linearize the overall transfer characteristics of the power amplifier, e.g., to suppress IMD products in its output signal. The above-described Doherty and Chireix amplification schemes are just two representative examples of such multistage power-amplifier circuits. From the description provided herein, one of ordinary skill in the art will be able to use transcoupling elements instead of conventional RF-circuit elements in various other circuits. Possible benefits/advantages of such use are already indicated above in reference to FIG. 4.

As used in this specification, the term "radio frequency" (RF) refers a rate of oscillation in the range of about 3 kHz to 300 GHz. This frequency may be the frequency of an electromagnetic wave or an alternating current in a circuit. This term should be construed to be inclusive of the frequencies used in wireless communication systems.

While this invention has been described with reference to illustrative embodiments, this description is not intended to be construed in a limiting sense.

Although RF circuit 400 (FIG. 4) has been described as being implemented using a microstrip technology, it can also be implemented using any other suitable technology, e.g., a coaxial technology or a planar (such as stripline, slotline, or planar-waveguide) technology. Other RF circuits disclosed in this specification can similarly be implemented using these technologies.

As used in the claims, the term "strip" should be construed to cover any conducting strip, such as a microstrip or a stripline, in the patterned layer of the corresponding planar circuit or printed circuit board.

In one embodiment, transcoupler 550 (FIG. 5) can be used in conjunction with one or more circuit elements that differ from directional coupler 510. For example, instead of being connected to microstrips 506 and 514, microstrip 554 of transcoupler 550 can be connected at the left (as viewed in FIG. 5) end thereof to a micro strip that has a width different from the width of microstrip 554 and the width of microstrip 562.

Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the invention. The use of terms such as height, length, width, top, bottom, is strictly to facilitate the description of the invention and is not intended to limit the invention to a specific orientation. For example, height does not imply only a vertical rise limitation, but is used to identify one of the three dimensions of a three dimensional structure as shown in the figures. Such "height" would be vertical where the microstrips are horizontal but would be horizontal where the microstrips are vertical, and so on.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The present inventions may be embodied in other specific apparatus and/or methods. The described embodiments are to be considered in all respects as only illustrative and not restrictive. In particular, the scope of the invention is indicated by the appended claims rather than by the description and figures herein. All changes that come within the meaning and range of equivalency of the claims are to be embraced within their scope.

What is claimed is:

1. A radio-frequency (RF) circuit for handling a plurality of modulated signals having a carrier wavelength, the RF circuit comprising a first transcoupling element that comprises:
   a first branch having a first end and a second end; and
   a second branch parallel to the first branch, wherein:
      the first branch is configured to operate as an impedance inverter that presents at the first end a first impedance, said first impedance being proportional to an inverse of a second impedance presented to the first branch at the second end; and
      the second branch is configured to operate as a signal coupler, wherein electromagnetic coupling between the first and second branches causes the second branch to receive an attenuated copy of a signal from the first branch.

2. The RF circuit of claim 1, wherein the first branch has a length, between the first and second ends, of about one quarter of the carrier wavelength.

3. The RF circuit of claim 1, wherein the first impedance is different from the second impedance.

4. The RF circuit of claim 3, wherein:
   the second impedance is a fixed impedance; and
   the first branch is configured to operate as an impedance transformer.

5. The RF circuit of claim 1, further comprising circuitry configured to change the second impedance over time.

6. The RF circuit of claim 5, wherein said circuitry comprises an amplifier.

7. The RF circuit of claim 1, wherein:
   the second branch has a first end and a second end;
   the electromagnetic coupling causes the first end of the second branch to carry an attenuated copy of a signal applied to the first end of the first branch; and
   the electromagnetic coupling further causes the second end of the second branch to carry an attenuated copy of a signal applied to the second end of the first branch.

8. The RF circuit of claim 7, wherein at least one of the first and second ends of the second branch is connected to a terminator.

9. The RF circuit of claim 1, wherein the first and second branches have different respective impedances.

10. The RF circuit of claim 1, wherein the second end is connected to at least two different lines external to the first transcoupling element.

11. The RF circuit of claim 10, wherein a first of said at least two different lines connects the second end to a second transcoupling element.

12. The RF circuit of claim 11, wherein a second of said at least two different lines connects the second end to a first amplifier.

13. The RF circuit of claim 12, wherein the first end is connected to a second amplifier.

14. The RF circuit of claim 1, further comprising a second transcoupling element that comprises:
   a respective first branch having a length, between a respective first end and a respective second end, of about one quarter of the carrier wavelength; and
   a respective second branch parallel to said respective first branch, wherein:
      the first end of said respective first branch is connected to the second end of the first branch of the first transcoupling element;
      the second end of said respective first branch is connected to a fixed impedance;
      said respective first branch is configured to operate as an impedance transformer; and
      said respective second branch is configured to operate as a signal coupler, wherein electromagnetic coupling between said respective first branch and said respective second branch causes said respective second branch to receive an attenuated copy of a signal from said respective first branch.

15. The RF circuit of claim 14, wherein the first branch of the first transcoupling element and said respective first branch of the second transcoupling element have different respective impedances.

16. The RF circuit of claim 1, further comprising:
   a dielectric substrate; and
   a patterned conductive layer adjacent to the dielectric substrate, wherein the patterned conductive layer comprises:
      a first strip that implements the first branch;
      a second strip along a side of the first strip and electromagnetically coupled to the first strip, said second strip implementing the second branch.

17. The RF circuit of claim 16, wherein:
   the patterned conductive layer further comprises a third strip connected to the first end;
   a distal end of the third strip is terminated by a shunt; and
   the third strip has a length, between the first end and the shunt, of about one quarter of the carrier wavelength.

18. The RF circuit of claim 16, wherein the patterned conductive layer further comprises first and second interdigitated combs located between the first and second strips, the first comb being attached to the first strip and the second comb being attached to the second strip.

19. The RF circuit of claim 1, wherein:
   the first transcoupling element is a four-terminal device;
   each of the four terminals is configured to carry a different respective modulated signal of the plurality of modulated signals;
   the first end of the first branch is directly electrically connected to a first terminal of the four terminals;

the second end of the first branch is directly electrically connected to a second terminal of the four terminals;
a first end of the second branch is directly electrically connected to a third terminal of the four terminals; and
a second end of the second branch is directly electrically connected to a fourth terminal of the four terminals.

20. The RF circuit of claim 19, wherein:
the first terminal is configured to receive a first modulated signal of the plurality of modulated signals;
the second terminal is configured to receive a second modulated signal of the plurality of modulated signals, said second modulated signal being different from the first modulated signal;
the third terminal is configured to output an attenuated copy of the first modulated signal; and
the fourth terminal is configured to output an attenuated copy of the second modulated signal.

* * * * *